(12) United States Patent
Ishii

(10) Patent No.: US 10,268,967 B2
(45) Date of Patent: Apr. 23, 2019

(54) MOLECULAR QUANTUM COMPUTER AND MOLECULAR QUANTUM STORAGE DEVICE

(71) Applicant: Keisaku Ishii, Tokyo (JP)

(72) Inventor: Keisaku Ishii, Tokyo (JP)

( * ) Notice: Subject to any disclaimer, the term of this patent is extended or adjusted under 35 U.S.C. 154(b) by 15 days.

(21) Appl. No.: 15/582,779

(22) Filed: May 1, 2017

(65) Prior Publication Data

US 2018/0315476 A1    Nov. 1, 2018

(51) Int. Cl.
*G06N 10/00* (2019.01)
*G11C 13/04* (2006.01)

(52) U.S. Cl.
CPC ........... *G06N 10/00* (2019.01); *G11C 13/047* (2013.01)

(58) Field of Classification Search
CPC .... G11C 13/047; G06N 99/002; G06N 10/00; G06N 99/007; B82Y 10/00
See application file for complete search history.

(56) References Cited

U.S. PATENT DOCUMENTS

| | | | |
|---|---|---|---|
| 2003/0040168 A1* | 2/2003 | Cain | B82Y 10/00 438/505 |
| 2009/0009165 A1* | 1/2009 | Ichimura | B82Y 10/00 324/304 |
| 2012/0075682 A1* | 3/2012 | Amoroso | G06N 99/002 359/1 |
| 2014/0187427 A1* | 7/2014 | Macready | G06N 99/002 505/170 |
| 2015/0358026 A1* | 12/2015 | Gan | G04F 5/14 331/94.1 |

OTHER PUBLICATIONS

Keisaku Ishii, et al., Ab initio Study of KN, The Journal of Chemical Physics 127, 194307 (2007), Nov. 21, 2007.
Keisaku Ishii, et al., Ab Initio Prediction of Spectroscopic Constants of CaN—, The Astrophysical Journal, 634, Nov. 21, 2005.
Keisaku Ishii, Best Molecular Multiple Quantum Bit for the Diatomic Molecular Quantum Computer—, International Journal of Quantum Chemistry 2014, Jun. 27, 2014.
Keisaku Ishii, et al., Theoretical Elucidation of the Unusually High—, The Astrophysical Journal, 636, Jan. 10, 2006.

* cited by examiner

*Primary Examiner* — David Lam
(74) *Attorney, Agent, or Firm* — Yokoi & Co., U.S.A.; Toshiyuki Yokoi

(57) ABSTRACT

In this statement, realization of "Non-volatile molecular multiple quantum bit (NVQB)" is described. NVQB is the long-term macroscopic time scale analog of MMQB. To realize NVQB, while inverted population of the gas is kept, entanglement generation and coherent state keeping must be carried out for a long-term quantum computation. Operating principle of molecular quantum computer is entanglement generation among huge-number of molecular ro-vibronic eigenstates by emission and absorption of photons due to the Fermi golden rule. Each single photon generated in induced absorption and induced emission sews many quantum states of many molecules by the Fermi golden rule. This results entanglement. When NVQB is realized, NVQB is not only used as "quantum storage device" up to $2^{Na}$, but also NVQB itself makes practical reasonable commercial molecular quantum computer be realized at once. NVQB is an alias of long-term successfully operating molecular quantum computer.

4 Claims, 1 Drawing Sheet

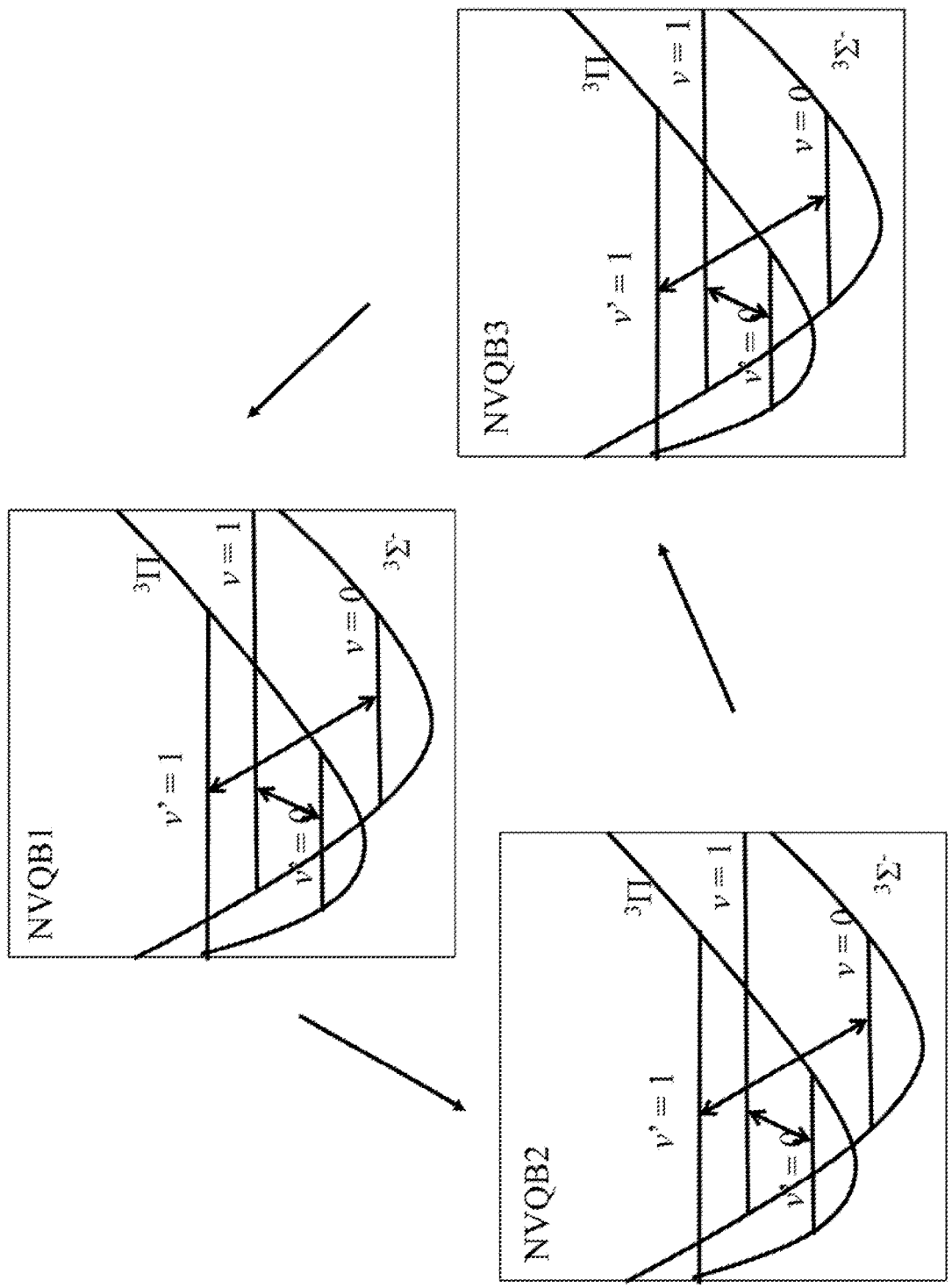

MOLECULAR QUANTUM COMPUTER AND MOLECULAR QUANTUM STORAGE DEVICE

BACKGROUND OF THE INVENTION

1. Field of the Invention

The present invention relates to a molecular multiple quantum bit (MMQB), a quantum storage device using the MMQB and a molecular quantum computer using the MMQB.

2. Description of the Related Art

Nowadays, almost all of the society mechanism controlling systems and industrial products are computer controlled. It is the same situation for computer simulation areas, such as molecular modeling (in the broad sense, including such as ab initio quantum chemistry, wave packet simulations, and molecular mechanics) and weather forecast. Thus, once faster computer is developed societies, people, and scientists demand further faster and faster computers. This has been the driving force of speedup of computers. Since fine processing technology of the silicon-based CPU and LSI devices has become its limit, also speedup of classical computer is on the limit.

Currently attention drawing technology is quantum computer. In quantum computer quantum bit, $C_0|0>+C_1|1>$, is utilized, instead of using separated classical bit, 0 and 1, based on quantum mechanical superposition principle, where $|0>$ and $|1>$ are any independent orthonormal quantum mechanical eigenstates and $C_0$ and $C_1$ are arbitrary complex number mixing coefficients satisfying the normalization condition, $|C_0|^2+|C_1|^2=1$. In quantum computer, by using quantum bit based on the superposition principle, super-parallel quantum computation can be done and quantum computer is ultra-fast. It is common recognition that 1,000,000,000-year classical computer calculation finishes within 2 or 3 s by using quantum computer. Therefore, when the practical reasonable commercial quantum computer is realized, revolution is brought to the computer world. To make quantum computer operate, entanglement and coherence keeping in quantum bits are necessary. In one quantum bit case, for example, varying and mixing of coefficients, $C_0$ and $C_1$, by incident laser are necessary.

So far, several successful working prototype quantum computers, such as atomic trapped ion, NMR, etc., have existed. Quantum computer already oscillated. Among them, atomic trapped ion is the best prototype. However, they cannot serve as practical reasonable commercial quantum computer, yet.

In quantum computer, NOT-gate (one quantum bit gate: $|0><1|+|1><0|$) and Controlled-NOT (CNOT)-gate (two quantum bit gate; $|00>\to|00>, |01>\to|01>, |10>\to|11>,$ and $|11>\to|10>$) are indispensable to carry out numerical operation. The two groups (de Vivie-Riedle and coworkers and Mishima and coworkers) and others calculated theoretically the concrete incident laser gate shape of NOT-gate, CNOT-gate, and other major quantum gates by optimal control theory (OCT).

The potential energy curves (PECs) of the $^3\Sigma^-$ and $^3\Pi$ electronic states of potassium nitride (KN) and the $^2\Pi$, $^4\Sigma^-$, $^2\Sigma^-$, and $^4\Pi$ electronic states of calcium nitride (CaN) were calculated at the complete active space self-consistent field and multi-reference configuration interaction plus Davidson's corrections for quadruple excitations with triple-zeta plus large polarization function level of theory (CASSCFF-MRCI(+Q)), which has the best quality for the system at present and thus obtained results are quantitative, and it was found that the two states of KN and the four states of CaN energetically nearly degenerate within 177 cm$^{-1}$ and ~1800 cm$^{-1}$, respectively. (K. Ishii, T. Taketsugu, and K. Yamashita, J. Chem. Phys. 127, 194307 (2007), K. Ishii and T. Taketsugu, Astrophys. J. 634, L201 (2005)).

Ro-vibronic state on the two lowest-lying electronic states of KN and the four lowest-lying electronic states of CaN is the best quantum state to define one-, two-, and further universal-quantum bit gate. I name the ro-vibronic state of KN and CaN "molecular multiple quantum bit (MMQB)" and molecular quantum computer utilizing nearly degenerate electronic states of the diatomic molecules "diatomic molecular quantum computer (DMQC)" (K. Ishii, Int. J. Quantum Chem. 114, 1486 (2014)). The combination of the four lowest vibronic states of KN is the best vibronic two-quantum bit.

As is described in the third reference, MMQB easily reaches thousand and has potentiality to reach the Avogadro number, Na ($6.02\times10^{23}$ mol$^{-1}$), because all of microwave (rotational), infrared, or UV-Vis spectra appearing in the molecular spectroscopy are the results of observation by photon-exchange among intramolecular quantum states from $10^{15}$ to $10^{23}$ (latter is the same order as Avogadro number) assembly of molecules interacting by the radiation (photons). Incidentally, $2^{300}$ far excesses number of atoms existing in the universe. Please imagine the situation when number of quantum bits becomes $2^{Na}$. Indeed, "the revolution" will happen. For details, please see the third reference.

In the diatomic KN and CaN molecules, there is only one symmetric stretching vibrational mode and decoherence by the intramolecular vibrational energy redistribution (IVR) among plural different vibrational modes, which is always anticipated in most of polyatomic molecules, does not have to be considered. Coherent states keep for a long time stably. Therefore, it is named "least decoherence". It is one of the most advantageous points of DMQC

BRIEF SUMMARY OF THE INVENTION

As a natural expansion of the concept of MMQB, when MMQB is fixed for a long macroscopic time duration it is "non-volatile molecular multiple quantum bit (NVQB)". NVQB can be used as not only ultra-huge storage device from $2^{1000}$ to $2^{Na}$, where Na is the Avogadro number ($6.02\times10^{23}$ mol$^{-1}$), but also NVQB itself makes realization of practical molecular quantum computer faster. NVQB is an alias of successful long-term operating MMQB. The operating principle of MMQB and NVQB is entanglement generation among many ro-vibronic states of the gas molecules through a series of emission and absorption of photons by the incident laser and laser-pulse due to the Fermi-golden rule. As a concrete way to realize long-term NVQB, the "exchange method" is described below.

BRIEF DESCRIPTION OF THE DRAWINGS

FIG. 1 shows schematic sketch of simplified concept of the "exchange method" of NVQB. Each panel shows the lowest vibronic two quantum bit of KN. Each panel represents independent moderate time NVQB and also represents the from 1 cm$^3$ to 22.4 l of gases including order of Na number of molecules in each chamber. Copying data, refreshment, and exchange among three each moderate time NVQB (NVQB1, NVQB2, and NVQB3) are continuously kept mutually, the set of each plural NVQB operation gives the long-term NVQB.

DETAILED DESCRIPTION OF THE INVENTION

The concept and operating principle necessary for realization of NVQB are as follows: a: concept) When operating time of MMQB (first defined in the third reference, "K. Ishii, Int. J. Quantum Chem., 114, 1486 (2014)."), which is oscillating in microscopic time duration, is successfully kept for macroscopic time duration it is non-volatile molecular multiple quantum bit (NVQB), and NVQB is not only possible to be used as "quantum storage device", needless to say, to $2^{1000}$ indeed up to $2^{Na}$, but also realization of NVQB itself makes accomplishment of practical reasonable commercial molecular quantum computer at once, because NVQB is an alias of successfully working long-term molecular quantum computer, b: operating principle; b-1) Since operating principles of NVQB are gate operation and entanglement generation caused by the repetition of absorption and emission of photons among many ro-vibronic quantum states of from thousand to the Avogadro number of the molecules by the incident laser and laser-pulse due to the Fermi golden rule, it is necessary to match the incident laser and laser-pulse shape for gate operation of quantum bits among huge number of molecular quantum eigenstates with gas laser oscillation of the molecules, such as carbonmonoxide (CO) laser, for a long time to keep inverted population and gate operation among the molecular ro-vibronic eigenstates simultaneously, b-2) In order to realize NVQB, entanglement generation as long as possible is necessary and since vibrational entanglement occurs within fs ($10^{-15}$ s) order and rotational entanglement occurs within ps ($10^{-12}$ s) order, to keep, for example, 1 h ($3.6 \times 10^3$ s) entanglement from $10^{15}$ to $10^{19}$ times entanglement generating continuous operations are necessary for the quantum gates, b-3) The operation can include null-operation, null-operation corresponds to identity gate ($|0\rangle\langle 0|+|1\rangle\langle 1|$), and identity gates can be used "to maintain bits and to keep data".

When the incident laser and laser-pulse are matched with the adequate gas laser oscillation of the molecules and inverted population is successfully realized, then each single photon emitted and absorbed by incident laser sews many eigenstates of molecules many times by the Fermi golden rule until the sewing is no more possible and this process keeps like chain reaction, and entanglement generation of KN and CaN occurs obeying the Schrödinger equation and the quantum mechanical superposition principle. Laser oscillation is already kept for a macroscopic long time duration. Concerning the gas lasers, number of oscillating molecules in the gas is near the Avogadro number, Na ($6.02 \times 10^{23}$ mol$^{-1}$). That is to say, while inverted population is kept, entanglement generation and gate operation among universal gates of molecules must be carried out. It is reemphasized that MMQB easily reaches $2^{1000}$, and has potentiality to reach $2^{Na}$ (see the third reference). Considering state equation (P V=n R T), knowing density (n/V=P/R T) and measuring intensity of emission of gas into some constant solid angle, from quantum mechanical duality relation between energy and frequency of single quantum (in this case, photon), $\varepsilon = h \omega$, ratio of emission and emitting molecules of molecular gas is understood. Then from the Fermi golden rule in molecular spectroscopy probability of how many percentage of molecules are in entanglement may be known. One molecule is in an excited state and emits a photon by the stimulated emission of incident laser, then another molecule in the lower state absorbs this emitted photon. It is the result of the Fermi golden rule and it leads to entanglement. Each single photon sews many quantum states by the Fermi golden rule until the sewing is no more possible and as a result entanglement is generated. During the mean free path and before decoherence by the collision between a pair among the molecules occurs incident laser and laser-pulse induce stimulated absorption and stimulated emission continuously due to the Fermi golden rule and keep the molecules be in entanglement. There is saturation condition of density of the molecules for entanglement. However, if the condition is too thinner, enough quantum bits cannot be taken. To find adequate density condition, experiences should be necessary. Therefore, since the standard state of gas includes Na number of molecules, needless to say NVQB easily becomes $2^{1000}$ (see the third reference), and NVQB has the potentiality to reach $2^{Na}$, NVQB can be used as stable long-term "quantum storage device". When the concept of NVQB is introduced into quantum computer itself realization of long-term stable molecular quantum computer is further accelerated and stability of molecular quantum computer itself becomes much firm, because NVQB is an alias of long-term successfully operating molecular quantum computer.

In KN the two electronic states, $^3\Sigma^-$ and $^3\Pi$, and in CaN the four electronic states, $^2\Pi$, $^4\Sigma^-$, $^2\Sigma^-$, and $^4\Pi$, nearly degenerate and they form best MMQB and NVQB (see the first, second, and third references). KN and CaN are easily generated by discharge of crystals of salt, such as potassium chloride (KCl) and calcium chloride ($CaCl_2$), under the flow of nitrogen gas, although vice-generative products, such as ClN, etc., should also be obtained. It is very easy and cost-effective. PECs of isovalent sodium nitride (NaN) and magnesium nitride (MgN), respectively, were also calculated. Concerning MgN, only PECs of the two electronic states have been calculated, the four electronic states, the same symmetries as CaN, should nearly degenerate in MgN. Therefore, MgN should be able to oscillate as MMQB and NVQB. Data are recorded and memorized in NVQB by entanglement generation among in long-term fixed MMQBs using stable both long-term laser and laser-pulse. Also, some experiences should be necessary for this process. In the case of KN and CaN combination use of microwave-laser, far infrared-laser, and infrared-laser is necessary to induce and to keep ro-vibronic entanglement. MMQB and NVQB fundamentally can be used as triple-purpose of CPU, memory, and needless to say, storages for practical molecular quantum computer, when NVQB oscillates for a long macroscopic time scale. MMQB and NVQB have potentiality to reach $2^{Na}$ bits and $2^{Na}$ quantum bits can be used as "CPU and memory" and also "storages". This is the meaning of the "in core" quantum computation. "Conventional storage device", so to speak, is in principle not necessary in quantum computation using MMQB and NVQB in molecular quantum computer. In other words, the result of making working time of MMQB operating in "in core" macroscopic time scale is NVQB.

Accordingly, MMQB is kept stable for the time duration of ten-year, it can be said that NVQB is almost accomplished because current magnetic hard disks or flash memory is wasted, disposed, or replaced before until ten-year or so have passed. As is the same as flash memory, before being wasted or disposed NVQB can be replaced. One-hour by one-hour, one-day by one-day, ten-day by ten-day, and one-month by one-month laser-controlling gradually becomes successful, realization of NVQB is near. If NVQB becomes unstable, however, the data can be copied to another fresh NVQB and the data are kept maintained continuously. Thus, for this purpose hugely sophisticated long-time laser and laser-pulse technique and technology controlling universal gate and generating entanglement to make NVQB keep on being fixed is necessary.

As a concrete invention to realize practical NVQB with minimum cost of developing long-term laser and laser-pulse technology, I propose the "exchange method"; a) In concrete, in one body about three each independent NVQB is implemented, making one of them work and making the other two take rest and be spares, among the three NVQBs copying the data, refreshment, and exchange when before the working one NVQB becomes unstable are mutually repeated constantly, it is one of the successful examples of the practical NVQB (FIG. 1), then, too much long-term each NVQB operation becomes unnecessary and about triply implemented reasonable time duration laser, laser-pulse and each independent NVQB operation are sufficient (the "exchange method" for NVQB realization), b-1) Further for notebook PC purpose, three each about 1 cm$^3$ of chamber of KN and CaN gas molecules implementation leads to success, b-2) For "super-computer", if the term of classical computer is used, three independent chambers containing the standard state of gas can be implemented, then 22.4 l of three each chamber contains Na number of molecules, b-3) For this purpose, consumption rate of power source of entanglement generation laser must be as low as possible and long-term battery is also necessary because during molecular quantum computer is connected to AC power source electricity supply is always kept, however, for mobile use and for fear of power outage the above two are inevitable to keep quantum computer non-volatile, b-4) As technology progresses, the exchange method can build "life span NVQB for each individual".

Among three, UNIX, UNIX-based Mac OS, and WINDOWS, any OS is adaptable for molecular quantum computer.

Graphical user interface (GUI) becomes ultra-faster and ultra-smoother than ever.

Since the RSA cryptosystem can be decoded using quantum computer (related to ultra-huge prime factor decomposition), conversely never decodable cipher in principle by the third party must be developed by NVQB and molecular quantum computer and security of internet becomes complete. Ii is re-emphasized that the bit which molecular quantum computer can handle even reaches $2^{Na}$. Individual privacies and public confidential matters will stiffly be protected from hackers.

Not only welfare-side, but also NVQB greatly contributes to national defense area.

NVQB can record, that is to say, all the contents of every encyclopedia, newspaper, journal, and book in the world from past to far future even in home-use, and needless to say, in commercial-use. Every picture, every film, every music-CD can be done, also. Every-source and -binary program is. Accessing the data is fast and easy.

In addition, through realization of molecular quantum computer, quantum chemistry calculations using ab initio full-CI and grid-based wave packet method for practically large molecules become feasible and greatly contribute large number of natural science and engineering other than the chemistry, biochemistry, biophysics, chemical physics, and quantum chemistry.

Quantum chemistry calculations, using above mentioned two methodologies, even though those ab initio quantum chemistry methodologies are ultra-progressive time, memory, and storage consuming with respect to the size of molecule, can be used in the areas of pharmacy, medicine, dietetics, biology, and material sciences. Determinant-based full-CI methodology is implemented in MOLPRO program package and two-dimensional wave packet simulations are common using classical computer. The two methodologies in principle completely reproduce and predict all of the chemical phenomena, including chemical structures and chemical reactions. Molecular quantum computer greatly contributes to human-health through ab initio computer chemistry for "bio-size supermacromolecule". Raising a few examples, the wave packet simulations on full-CI potential energy surfaces (PESs) will elucidate reaction mechanism of central dogma of molecular biology, that is, transcription of genetic codes of DNA by RNA, which means protein generation from various amino acids through peptide bonds formation on RNA, mechanism of replication of DNA, mechanism of metabolism (slow combustion of carbohydrate, fat, etc., with enzyme), action of minerals, hormones, and vitamins, and structure of nerves, all in body all full quantum mechanically. They elucidate secrets of Human body. Phenomenon such as bifurcation of wave packet (K. Ishii et al. Astrophys. J. 636, 927 (2006)) does not appear in classical mechanics. It is a particular "quantum mechanical effect". The bifurcation of wave packet may be observed in biochemical systems. Almost all of the microscopic biological problems at least at molecule levels will be theoretically predicted, reproduced, and solved quantitatively and thoroughly using NVQB and molecular quantum computer. Good modeling by/of from hundreds to several hundred thousand atomic system will be developed. In order to carry out simulations correctly, inclusion of solvent, that is, water is inevitable. The simulations also will elucidate the role of start codon (AUG) and termination codons (UAA, UAG, and UGA). This level of load of the quantum chemistry simulations is too much heavy even for the today's fastest classical computer and never can be done yet. When MMQB, NVQB, and molecular quantum computer is realized, it is easily done. The remaining concern is how to visualize molecular structures and chemical reactions of supermacromolecules for bio-systems (and for others) quantum mechanically using GUI in 3D. It will also be done by molecular quantum computer. Through above-mentioned quantum chemistry simulations, drastic changes will be brought into biochemistry and biophysics of supermacro-biomolecules.

Molecular quantum computer and NVQB contribute to medical science, auto-surgery, auto-operations through microscopic atoms and molecules level controlling.

MMQB, NVQB, and molecular quantum computer are useful for not only natural science and engineering, but they also greatly contribute to social sciences and liberal arts.

Further, other purposes of MMQB, NVQB, and molecular quantum computer are widespread and they contribute to other many situations in daily life of Human being. For example, weather forecast becomes more precise and accurate than ever. Even climate controlling can be done. The issue of global warming will be resolved. Controlling of artificial satellite becomes complete. Stability of telecommunication systems also becomes stiff. Global, both each domestic and international, society mechanism controlling is possible through, raising a few technical examples, for example, traffic systems controlling, wide area POS systems, railway systems controlling, distribution system controlling, and autopilot of airplanes, ships, production plants, and power plants. Even though they are partly done by classical computer, by using molecular quantum computer and NVQB they become complete. They are related to, for example, analyses of big data.

To summarize, NVQB is a macroscopic long-time analogue of MMQB. "Non-volatile molecular multiple quantum bit (NVQB)" is the result that MMQB is successfully in entanglement, in coherent state, and oscillates for a macroscopic long time duration. In order to realize NVQB highly-tuned long-time laser and laser-pulse techniques to generate entanglement among one-, two-, and universal-gate are indispensable. By the "exchange method" among about triply implemented each independent NVQB, laser-controlling time for entanglement generation becomes moderate. Order of hour, day, and month successful continuous entanglement is necessary. When NVQB is accomplished and oscillates, NVQB is not only ultra-huge quantum storage device up to $2^{Na}$ quantum bits, but also NVQB, which is based on MMQB, makes stable reasonable commercial molecular quantum computer be realized at once. NVQB is an alias of successful long-term molecular quantum computer.

Note that, this invention is not limited to the above-mentioned embodiments. Although it is to those skilled in the art, the following are disclosed as the one embodiment of this invention.

Mutually substitutable members, configurations, etc. disclosed in the embodiment can be used with their combination altered appropriately.

Although not disclosed in the embodiment, members, configurations, etc. that belong to the known technology and can be substituted with the members, the configurations, etc. disclosed in the embodiment can be appropriately substituted or are used by altering their combination.

Although not disclosed in the embodiment, members, configurations, etc. that those skilled in the art can consider as substitutions of the members, the configurations, etc. disclosed in the embodiment are substituted with the above mentioned appropriately or are used by altering its combination.

While the invention has been particularly shown and described with respect to preferred embodiments thereof, it should be understood by those skilled in the art that the foregoing and other changes in form and detail may be made therein without departing from the sprit and scope of the invention as defined in the appended claims.

What is claimed is:

1. A molecular quantum computer operating for a macroscopic long time duration, comprising:
   chambers that have KN and CaN;
   lasers that make laser radiation and laser pulse incident into the chambers, wherein
   a gate operation is carried out in accordance with an operation principle of which are, in the chambers, keeping inverted population, keeping a series of repetition of induced absorption and induced emission among many of ro-vibronic states of from thousands to the Avogadro number of the molecules in entanglement by the Fermi golden rule.

2. The molecular quantum computer operating in a macroscopic long time duration according to claim 1, wherein
   for which an exchange method of the chambers that have each three independent chamber to utilize each three independent chamber mutually in order to make working time of each chamber moderate is implemented.

3. A quantum storage device operating in a macroscopic long time duration, comprising:
   chambers that have KN and CaN,
   lasers that make laser radiation and laser pulse incident into the chambers, wherein
   a gate operation is carried out in accordance with an operation principle of which are, in the chambers, keeping inverted population, keeping a series of repetition of induced absorption and induced emission among many of ro-vibronic states of from thousands to the Avogadro number of the molecules in entanglement by the Fermi golden rule.

4. The quantum storage device operating for a macroscopic long time duration according to claim 3, wherein
   for which an exchange method of the chambers that have each three independent chamber to utilized each three independent chamber mutually in order to make working time of each chamber moderate is implemented.

* * * * *